United States Patent
Namekawa et al.

(10) Patent No.: US 8,032,815 B2
(45) Date of Patent: Oct. 4, 2011

(54) SEMICONDUCTOR MEMORY DEVICE

(75) Inventors: Toshimasa Namekawa, Ota-ku (JP);
Hiroaki Nakano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1124 days.

(21) Appl. No.: 11/773,694

(22) Filed: Jul. 5, 2007

(65) Prior Publication Data
US 2008/0016427 A1    Jan. 17, 2008

(30) Foreign Application Priority Data
Jul. 14, 2006 (JP) .................................. 2006-194434

(51) Int. Cl.
*G11C 29/00* (2006.01)
(52) U.S. Cl. ...................................................... 714/764
(58) Field of Classification Search .......... 714/763–764; 365/200–201, 185.09
See application file for complete search history.

(56) References Cited

U.S. PATENT DOCUMENTS

| 5,179,536 | A | * | 1/1993 | Kasa et al. | 365/200 |
| 5,357,470 | A | | 10/1994 | Namekawa et al. | |
| 5,798,973 | A | * | 8/1998 | Isa | 365/200 |
| 5,822,257 | A | * | 10/1998 | Ogawa | 365/200 |
| 6,115,301 | A | | 9/2000 | Namekawa | |
| 6,697,992 | B2 | * | 2/2004 | Ito et al. | 714/763 |
| 7,076,722 | B2 | | 7/2006 | Shibata | |

* cited by examiner

*Primary Examiner* — Shelly A Chase
(74) *Attorney, Agent, or Firm* — Oblon, Spivak, McClelland, Maier & Neustadt, L.L.P.

(57) ABSTRACT

A semiconductor memory device configured to execute a standby operation for saving power during standby, and including a memory cell array including plural memory cells arranged at intersections of bit lines and word lines and storing cell data. A redundant memory cell array shares the bit lines with the memory cell array and includes plural redundant memory cells arranged at intersections of the bit lines and redundant word lines storing redundant data for error correction of cell data stored in the memory cell array. A sense amplifier senses and amplifies the voltage on the bit line to read the cell data or the redundant data from the memory cell array or the redundant memory cell array. A cyclic redundant encoder/decoder, through sequential processing, encodes the cell data to generate the redundant data, or decodes the cell data and the redundant data for error correction of the cell data.

12 Claims, 9 Drawing Sheets

| step | D0 | D1 | D2 | D3 |
|---|---|---|---|---|
| S103 |  | 0 | 0 | 0 |
| S105-1 | 1 | 1 | 1 | 0 |
| S105-2 | 0 | 0 | 1 | 1 |
| S105-3 | 1 | 0 | 0 | 1 |
| S105-4 | 0 | 1 | 1 | 0 |

| step | D1 | D2 | D3 | CD |
|---|---|---|---|---|
| S107-0 | 1 | 1 | 0 | 0 |
| S107-1 | 0 | 1 | 1 | 1 |
| S107-2 | 0 | 0 | 1 | 1 |

| step | D0 | D1 | D2 | D3 |
|---|---|---|---|---|
| S303 |  | 0 | 0 | 0 |
| S305-1 | 1 | 1 | 0 | 0 |
| S305-2 | 0 | 0 | 1 | 0 |
| S305-3 | 1 | 1 | 0 | 1 |
| S305-4 | 0 | 1 | 0 | 0 |
| S305-5 | 0 | 0 | 1 | 0 |
| S305-6 | 1 | 1 | 0 | 1 |
| S305-7 | 1 | 0 | 0 | 0 |

| step | D0 | D1 | D2 | D3 |
|---|---|---|---|---|
| S303 |  | 0 | 0 | 0 |
| S305-1 | 1 | 1 | 0 | 0 |
| S305-2 | 0 | 0 | 1 | 0 |
| S305-3 | (0) | 0 | 0 | 1 |
| S305-4 | 0 | 1 | 1 | 0 |
| S305-5 | 0 | 0 | 1 | 1 |
| S305-6 | 1 | 0 | 1 | 1 |
| S305-7 | 1 | 0 | 1 | 1 |

| step | D0 | D1 | D2 | D3 | SYN | CD |
|---|---|---|---|---|---|---|
| S303 | | 0 | 1 | 1 | 0 | |
| S305-1 | 1 | 1 | 1 | 1 | 0 | 1 |
| S305-2 | 0 | 1 | 0 | 1 | 0 | 0 |
| S305-3 | (0) | 1 | 0 | 0 | 1 | 1 |
| S305-4 | 0 | 0 | 1 | 0 | 0 | 0 |
| S305-5 | 0 | 0 | 0 | 1 | 0 | 0 |
| S305-6 | 1 | 1 | 1 | 1 | 0 | 1 |
| S305-7 | 1 | 0 | 1 | 1 | 0 | 1 |

SEMICONDUCTOR MEMORY DEVICE

CROSS REFERENCE TO RELATED APPLICATION

This application is based on and claims the benefit of priority from prior Japanese Patent Application No. 2006-194434, filed on Jul. 14, 2006, the entire contents of which are incorporated herein by reference.

BACKGROUND OF THE INVENTION

1. Field of the Invention

The present invention relates to a semiconductor memory device, and more particularly to a semiconductor memory device configured to execute a standby function for saving power on a standby operation.

2. Description of the Related Art

Semiconductor memory devices, particularly those for use in mobile terminals have been strongly requested to reduce power consumption during standby. In response to the request, there have been proposed such semiconductor memory devices that have a standby operation function (standby function) of lowering the supply voltage during standby, for example.

By way of example, for a DRAM (Dynamic Random Access Memory) that requires data rewrite (refresh), reductions in power consumption during standby have been strongly requested. The DRAM, as it requires data rewrite, is thought to consume large power on standby. In practice, however, a power saving is made possible through designs such as a lowered supply voltage on standby operation and an elongated data write interval (see, for example, U.S. Pat. No. 7,145,819). It has been found that the DRAM is more advantageous in saving power than a SRAM (Static Random Access Memory) that requires no data rewrite.

The power saving with the lowered supply voltage and the elongated rewrite interval, however, may cause an error in data stored in a DRAM cell. The data retention property of the DRAM cell greatly varies among DRAM cells. If the lower limit of the supply voltage and the upper limit of the rewrite interval are determined to fit some DRAM cells poor in data retention property, the power saving is also limited.

Therefore, it may be considered that the DRAM cells poor in data retention property can be treated with a redundant cell replacement or an error correction while the supply voltage is lowered or the rewrite interval is determined with reference to other DRAM cells excellent in data retention property.

The redundant cell replacement is a relief means that is utilized for the purpose of relieving a failure mainly caused during a production stage. Therefore, a proportion of the number of relievable cells to the storage capacity (hereinafter referred to as a relief rate) is designed on the basis of a production failure rate. In general, for a storage capacity of several M bits, there are prepared spare cells just enough to relieve several failed cells and a non-volatile memory (for storing faulty addresses). The use of the redundant cell replacement means for the purpose of improving the data retention property in saving power on standby as described above requires the relief rate to be improved several times to several tens of times. In that case, the redundant cells are prepared aligned in the row and column directions. Therefore, the area proportion of the redundant cells is expected to reach several 10% of the whole memory cells and the area overhead is expected to become an unallowable extent.

The error correction is a relief means that is utilized for the purpose of correcting a soft error mainly caused by the influence of radioactive rays. The error correction scheme may often add around 10% redundant bits to the data bit width of original data. This can be easily used for the purpose of complementing the deterioration of the data retention property associated with the power saving on the standby function operation as described above. The use of such a scheme for this purpose allows the proportion of redundant bits to exceed 10%, which results in an area increase unallowable in mobile instruments required for saving power. An increase in data bit width allows the proportion of redundant bits to be lowered relatively. In this case, however, the circuitry scale of the encoder and decoder required for error correction is made larger. Eventually, the area increase rate associated with the error correction means mounted is hardly kept lower than 10%.

The problem about the data error associated with the standby operation during such standby may arise not only in the DRAM that requires rewrite as described above but also in other semiconductor memory devices that require no rewrite but have a standby function, such as a SRAM and a flash EEPROM similarly.

SUMMARY OF THE INVENTION

In an aspect the present invention provides a semiconductor memory device configured to execute a standby operation for saving power during standby, the device comprising: a memory cell array including a plurality of memory cells arranged at intersections of bit lines and word lines and operative to store cell data; a redundant memory cell array including a plurality of redundant memory cells arranged at intersections of the bit lines and redundant word lines and operative to store redundant data for error correction of cell data stored in the memory cell array; a sense amplifier operative to sense and amplify the voltage on the bit line to read the cell data or the redundant data from the memory cell array or the redundant memory cell array; a cyclic redundant encoder/decoder operative to encode the cell data through sequential processing to generate the redundant data or operative to decode the cell data and the redundant data through sequential processing to execute error correction of the cell data; a row decoder operative to selectively activate the word line or the redundant word line in accordance with a row address signal; and a column decoder operative to selectively activate the bit line in accordance with a column address signal.

DETAILED DESCRIPTION OF THE EMBODIMENTS

Figure 1:
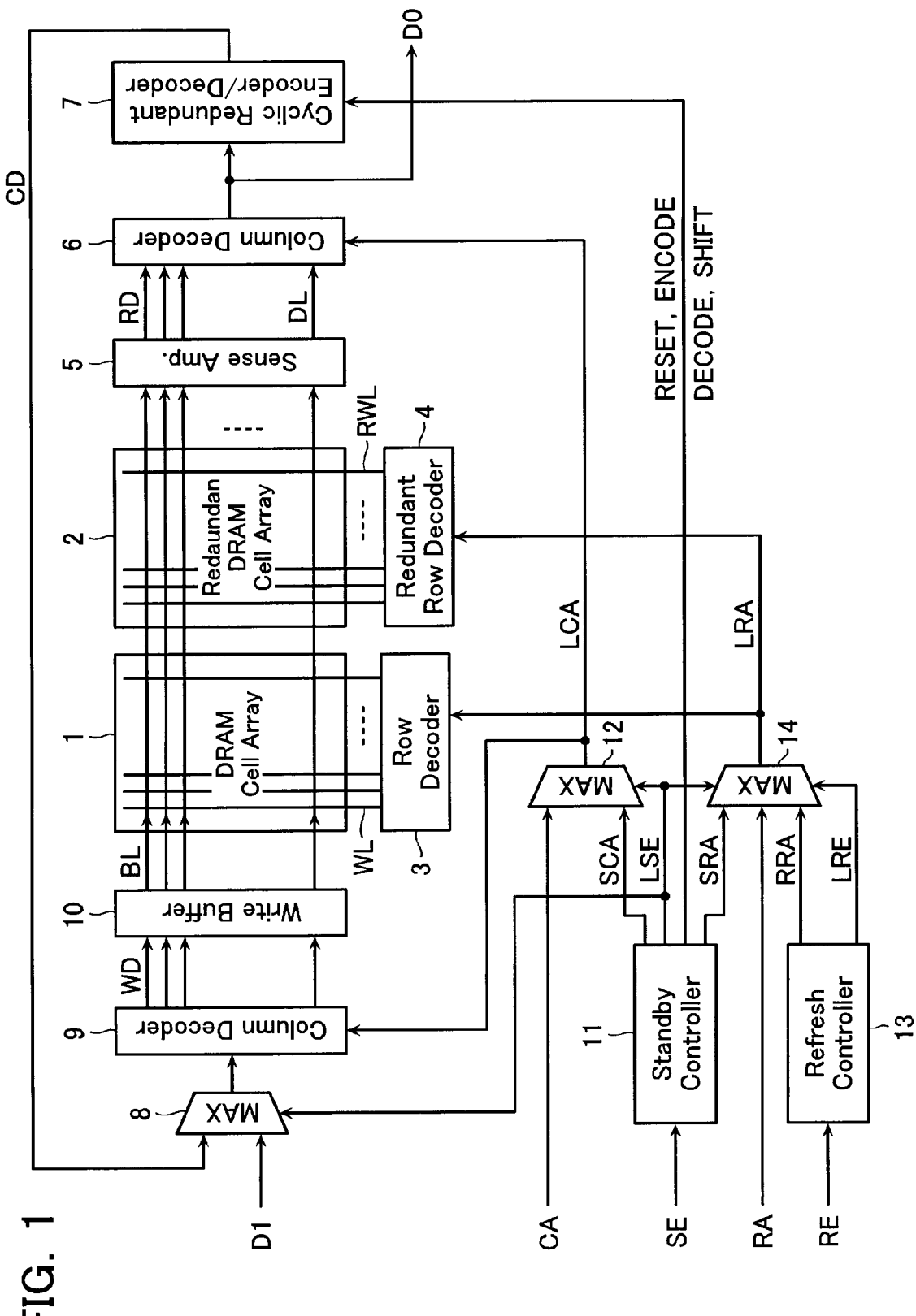
FIG. 1 is a block diagram showing a configuration of a semiconductor memory device according to an embodiment of the present invention.

The embodiment of the present invention will now be described in detail with reference to the drawings. FIG. 1 is a block diagram showing a configuration of a semiconductor memory device according to an embodiment of the present invention. The semiconductor memory device comprises a memory cell array 1 including a plurality of DRAM cells arranged at intersections of word lines WL and bit lines BL and a redundant memory cell array 2 arranged adjacent thereto (on the right side in FIG. 1).

The redundant memory cell array 2 shares the bit lines BL with the memory cell array 1 and includes a plurality of redundant DRAM cells at intersections of redundant word lines RWL and the bit lines BL. The redundant memory cell array 2 is configured to store redundant data added for error correction of cell data stored in the memory cell array 1.

The memory cell array 1 is connected to a row decoder 3 via the word lines WL. The row decoder 3 has a function of selectively activating the plurality of word lines WL. The redundant memory cell array 2 is connected to a redundant row decoder 4 via the redundant word lines RWL. The redundant row decoder 4 has a function of selectively activating the plurality of redundant word lines RWL.

The bit lines BL have one end connected to a sense amplifier 5. The sense amplifier 5 has a function of sensing and amplifying a small signal read out of the memory cell array 1 or the redundant memory cell array 2 and providing it as read data RD (cell data or redundant data). The sense amplifier 5 has output terminals connected to a read-side column decoder 6. Based on an internal (local) column address LCA, the read-side column decoder 6 selects a data line DL to lead the read data RD, and provides output data DO to external.

A cyclic redundant encoder/decoder 7 may comprise a linear feedback shift register (LFSR), which is configured to receive the output data DO bit by bit as cyclic codes and sequentially execute encoding and decoding to provide encoded/decoded data CD. The semiconductor memory device of this embodiment executes a standby operation for saving power during a normal operation for performing normal data read/write and so forth. The cyclic redundant encoder/decoder 7 is configured operable on standby operation and inoperable on normal operation for correction of data errors caused by power saving on standby operation. The configuration of the cyclic redundant encoder/decoder 7 will be detailed later.

The bit lines BL have the other end (on the left side of the memory cell array 1 in FIG. 1) connected to a data multiplexer 8, a write-side column decoder 9 and a write buffer 10.

The data multiplexer 8 transfers external input data DI fed from external, to the write-side column decoder 9 on normal operation. On the other hand, it transfers the encoded/decoded data CD from the cyclic redundant encoder/decoder 7, instead of the external input data DI, to the write-side column decoder 9, on standby operation, in accordance with an internal standby control signal LSE later described.

The write-side column decoder 9 select one of write data lines WD in accordance with the internal column address LCA later described. The write buffer 10 is connected between the write data lines WD and the bit lines BL.

The semiconductor memory device also comprises a standby (sleep) controller 11, a column address multiplexer 12, are fresh controller 13, and a row address multiplexer 14, for standby and rewrite operations.

The standby controller 11, in accordance with a standby state control signal SE fed from external to instruct starting a standby operation, provides a column address (standby control column address) SCA as well as a row address (standby control row address) SRA with regard to a memory cell to be addressed in the memory cell array 1 for data error correction on standby operation, and the internal standby control signal LSE. The standby controller 11 also provides control signals for controlling the cyclic redundant encoder/decoder 7, such as a reset signal RESET, an encoding instruction signal ENCODE instructive of starting encoding, a decoding instruction signal DECODE instructive of starting decoding, and a shift instruction signal SHIFT instructive of reading an internal state.

The column address multiplexer 12 is configured to select one from inputs of a column address CA fed from external for normal read/write in the memory cell array 1 and a standby control column address SCA, in accordance with the above-described internal standby control signal LSE, and to feed the selected one as the internal column address LCA to the write-side column decoder 9 and the read-side column decoder 6.

The refresh controller 13, in accordance with a rewrite control signal RE fed from external, provides an operation internal control signal LRE, and a row address (standby control row address) RRA of a memory cell to be rewritten on rewrite operation in the memory cell array 1.

The row address multiplexer 14 selects one from inputs of a row address RA fed from external, a standby control row address SRA, and a rewrite row address RRA. This selection is performed in accordance with the internal standby control signal LSE and the operation internal control signal LRE. The selected input RA, SRA or RRA is supplied as an internal row address LRA to the row decoder 3 and the redundant row decoder 4.

The semiconductor memory device of the embodiment also comprises a supply line for supplying a supply voltage required for operation and a clock signal line for transmitting a clock signal to define operation timings, which are though omitted from the drawings. FIG. 1 illustrates the configuration for correction of data errors caused on standby operation in the semiconductor memory device. A configuration for correction of data errors caused on normal operation can also be provided additionally.

Figure 2:
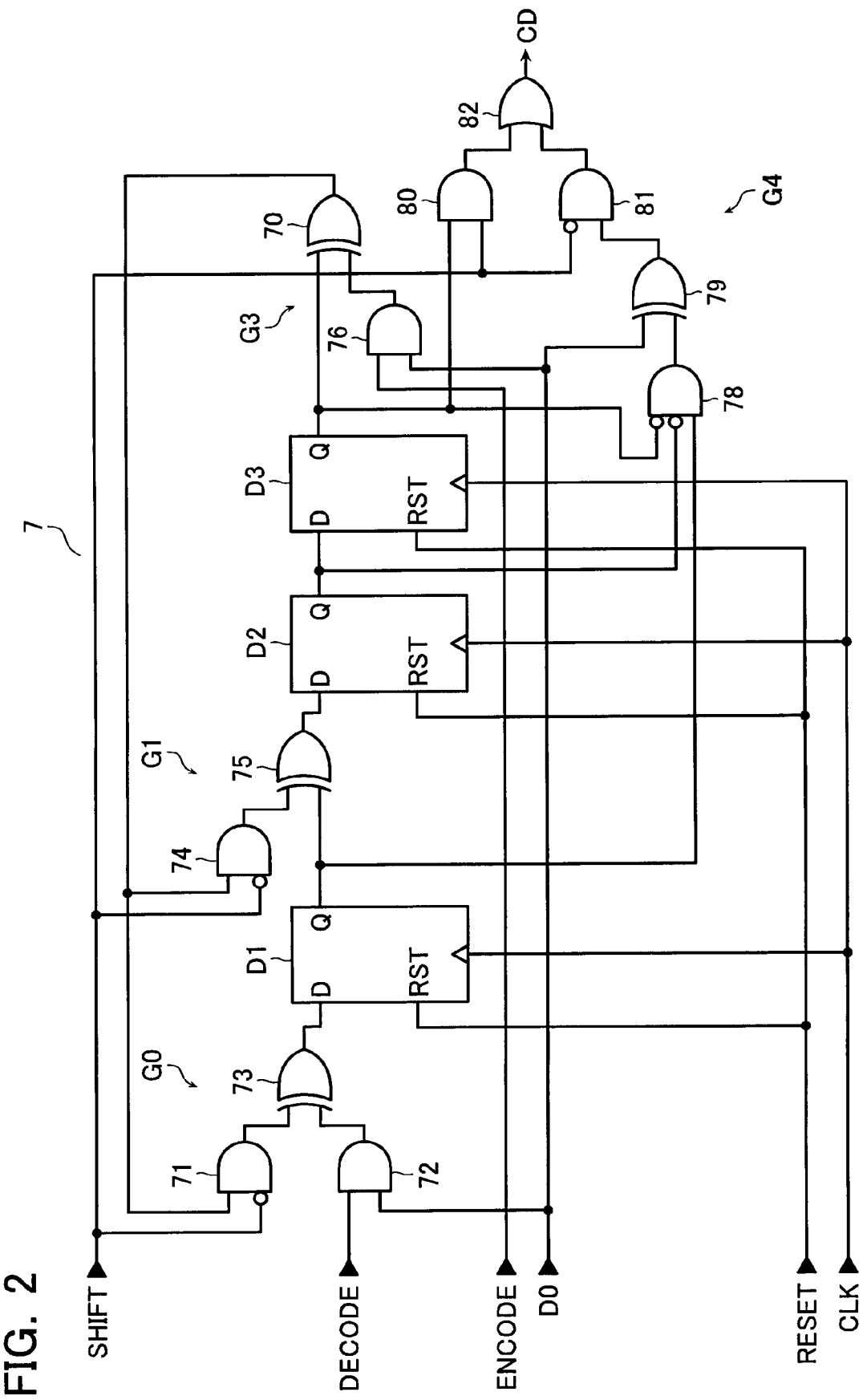
FIG. 2 is a circuit diagram showing details in a configuration of a cyclic redundant encoder/decoder 7 shown in FIG. 1.

FIG. 2 is a circuit diagram showing details in the configuration of the cyclic redundant encoder/decoder 7. The cyclic redundant encoder/decoder 7 includes D-type flip-flops D1, D2, D3 serving as memory elements in a shift register. The D-type flip-flops D1, D2, D3 are serially connected in this order. The D-type flip-flop takes in a signal on the input terminal (D) at the timing of a rise of the clock signal CLK and provides it from the output terminal (Q), holding the state of the output terminal (Q) at other timings. This example exemplifies a linear feedback shift register (LFSR) that executes encoding through the use of (7, 4) cyclic hamming code. It has an ability of correcting any 1-bit error caused in a full message bit string by adding 3 redundant bits to an information bit string of 4 bits. The present invention is not limited to this code but may also use (15, 11) cyclic hamming code, (31, 26) cyclic hamming code, (63, 57) cyclic hamming code, (127, 120) cyclic hamming code, and (255, 247) cyclic hamming code. In addition, BCH code and Reed-Solomon code may also be available.

The cyclic redundant encoder/decoder 7 includes logic gates 70-82. These logic gates 70-82 are connected as described below and supplied with the above-described control signals SHIFT, DECODE, ENCODE, RESET. Thus, the cyclic redundant encoder/decoder 7 can serve as an encoder, a decoder, a syndrome pattern detector or an error corrector, depending on the situation.

The D-type flip-flop D3 on the final stage has an output terminal (Q) connected to the logic gate 70 operative to provide an exclusive-OR of inputs. The logic gate 70 has an output terminal connected to one of input terminals of the logic gate 71. The logic gate 71 is an AND gate, which, with the other input terminal supplied with the inverted signal (/SHIFT) of a shift instruction signal SHIFT, provides an AND. The logic gate 72 is an AND gate operative to provide an AND of the decoding instruction signal DECODE and the output data DO. The logic gate 73 is arranged so as to receive the output signals from the logic gates 71 and 72 and provide an exclusive-OR thereof. It has an output terminal connected to the input terminal (D) of the D-type flip-flop D1 on the first stage. The logic gates 71-73 serve as an exclusive-OR operational unit G0 when the cyclic redundant encoder/decoder 7 is used as the decoder.

The logic gate 74 provides an AND of the output signal from the logic gate 70 and the inverted signal (/SHIFT) of the shift instruction signal SHIFT and has an output terminal connected to one of input terminals of the logic gate 75. The logic gate 75, with the other of input terminals connected to the output terminal (Q) of the D-type flip-flop D1, provides an exclusive-OR of both inputs as an output signal. It has an output terminal connected to the input terminal (D) of the D-type flip-flop D2 on the second stage. The logic gates 74 and 75 serve as an exclusive-OR operational unit G1 when the cyclic redundant encoder/decoder 7 is functioned as the encoder or the decoder.

The logic gate 76 is arranged as a circuit operative to provide an AND of the output data DO and the encoding instruction signal ENCODE. The logic gate 76 has an output terminal connected to one of input terminals of the above-described logic gate 70. The logic gates 70 and 76 serve as an exclusive-OR operational unit G3 when the cyclic redundant encoder/decoder 7 is functioned as the encoder.

The logic gate 78 is arranged as a circuit operative to provide an AND of the output signal from the D-type flip-flop D1 and the inverted signals of the output signals from the D-type flip-flops D2 and D3. The logic gate 78 provides "1" when the values held in the D-type flip-flops D1-D3 are equal to (1, 0, 0). The output signal from the logic gate 78 is fed to one of input terminals of the logic gate 79. The other of input terminals of the logic gate 79 is supplied with the output data DO, and the logic gate 79 provides an exclusive-OR of both inputs to external from the output terminal thereof. The logic gates 78 and 79 serve as a syndrome pattern detector and error corrector G4 when the cyclic redundant encoder/decoder 7 is used as the decoder.

The logic gate 80 is arranged as a circuit operative to provide an AND of the output signal from the D-type flip-flop D3 and the shift instruction signal SHIFT. The logic gate 81 is arranged as a circuit operative to provide an AND of the inverted signal (/SHIFT) of the shift instruction signal SHIFT and the output signal from the logic gate 79. The logic gate 82 is arranged as a circuit operative to provide an OR of the output signals from the logic gates 80 and 81, that is, the encoded/decoded data CD.

The operations of the semiconductor memory device of FIG. 1 are described separately in a normal operation state and a standby operation state.

The operation of writing and reading in the normal operation state is described first. This operation is similar to that of the known semiconductor memory device. In this case, the internal standby control signal LSE is set at "L" such that the data multiplexer 8, the column address multiplexer 12 and the row address multiplexer 14 are supplied with the external input data DI, the column address CA and the row address RA, respectively. Thus, on writing, the write data given as the external input data DI is written in a memory cell addressed by the column address CA and the row address RA in the memory cell array 1. On reading, the data held in a memory cell addressed by the column address CA and the row address RA in the memory cell array 1 is read out as the output data DO.

Figure 3:
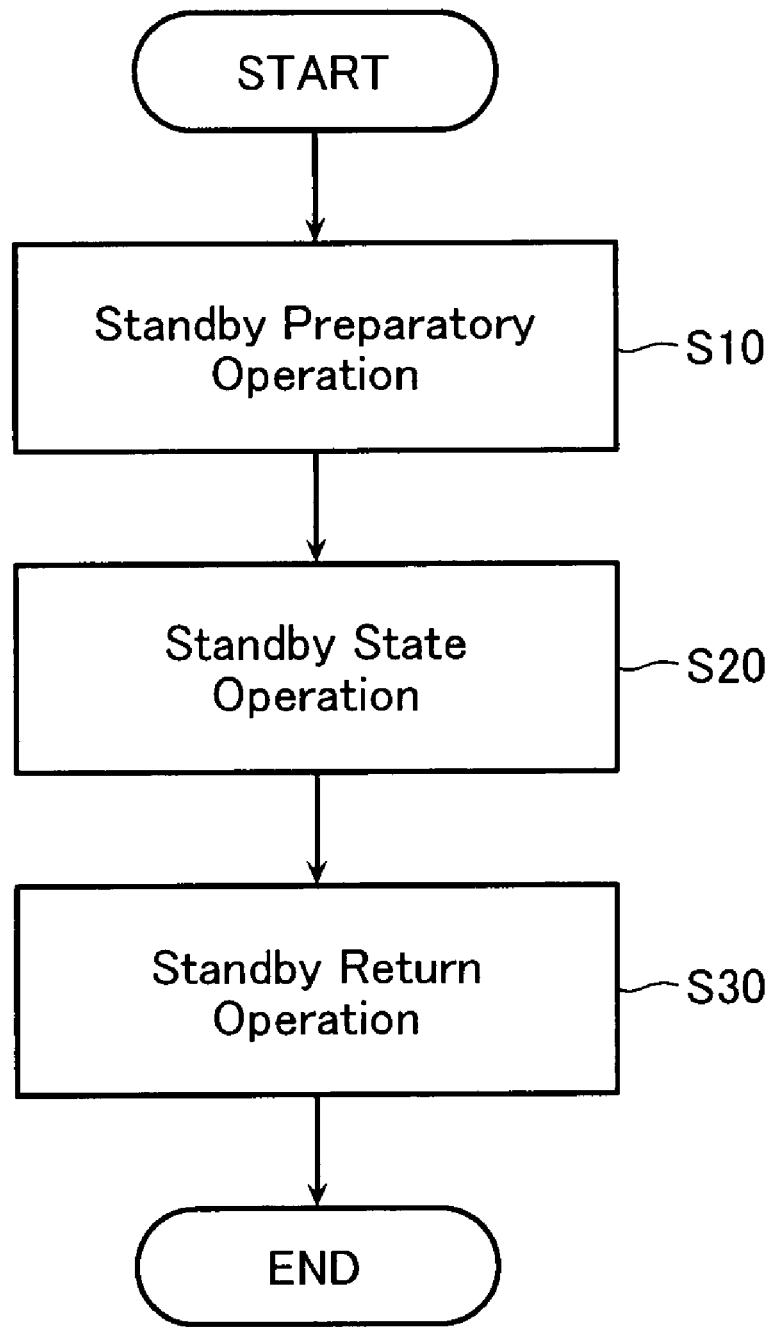
FIG. 3 is a flowchart illustrative of an operation of the standby function in the semiconductor memory device of the present embodiment.
Figure 5:
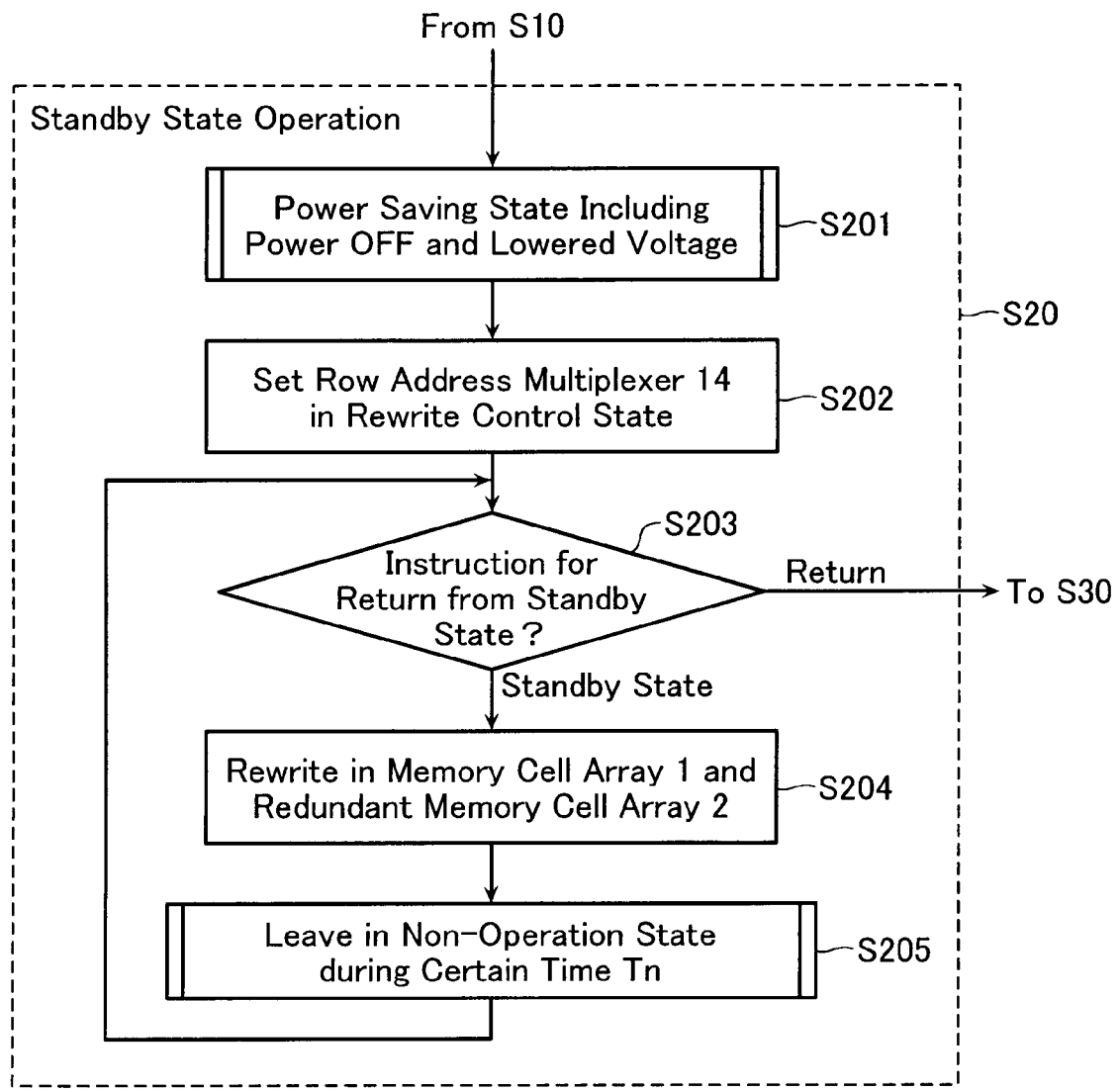
FIG. 5 is a flowchart illustrative of an operation of the standby function in the semiconductor memory device of the present embodiment.
Figure 6:
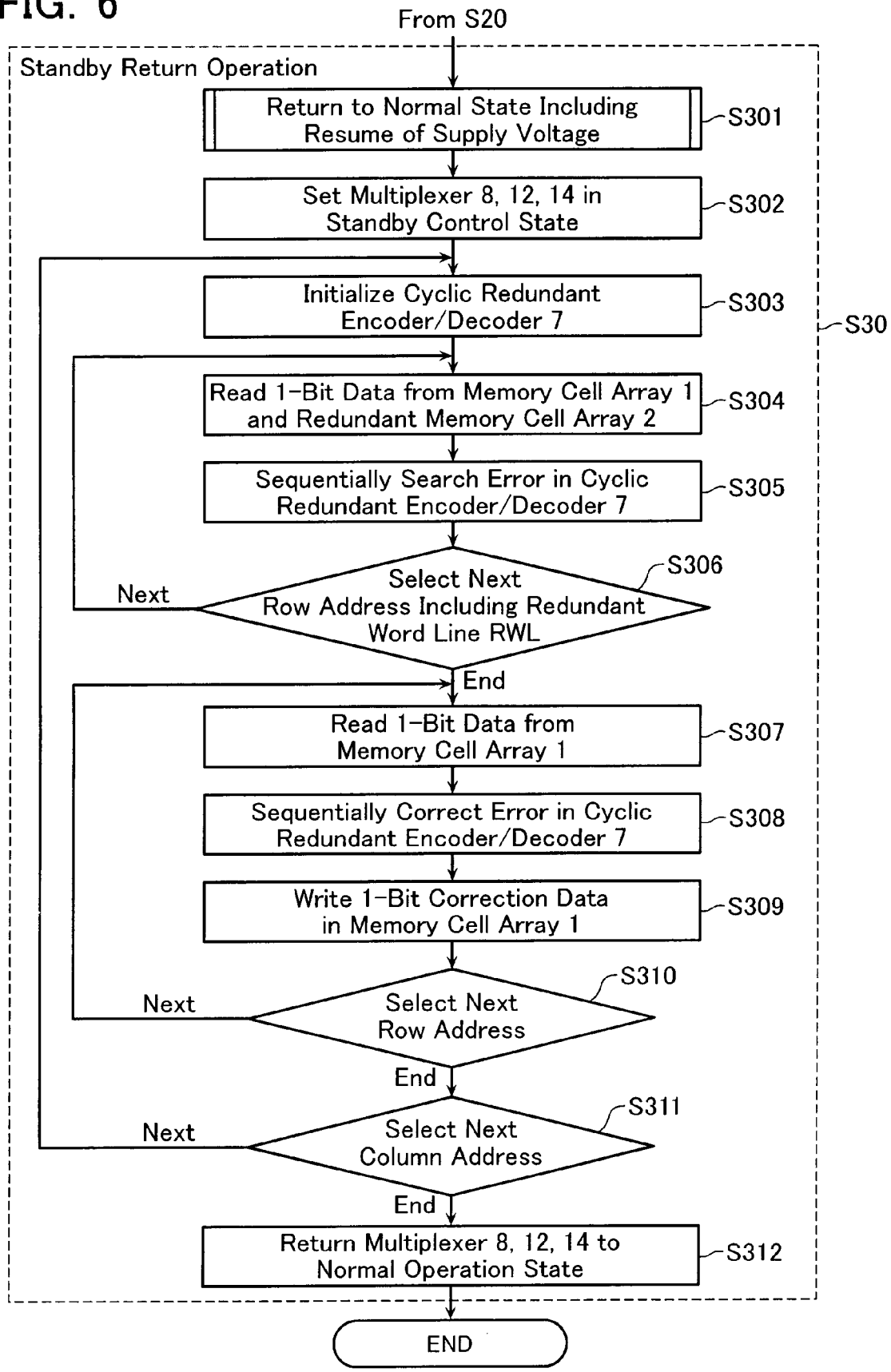
FIG. 6 is a flowchart illustrative of an operation of the standby function in the semiconductor memory device of the present embodiment.

The standby operation, which is characteristic of the semiconductor memory device of the present embodiment, is described with reference to FIGS. 3-6. The standby operation is executed as shown in FIG. 3 in the following order: a standby preparatory operation (S10) for preparing transition to the standby operation; a standby state operation (S20) for saving power; and a standby return operation (S30) for correcting a data error caused during the standby operation and returning to the normal operation state. Detailed procedures of the operations S10, S20, S30 are shown in FIGS. 4-6.

Figure 4:
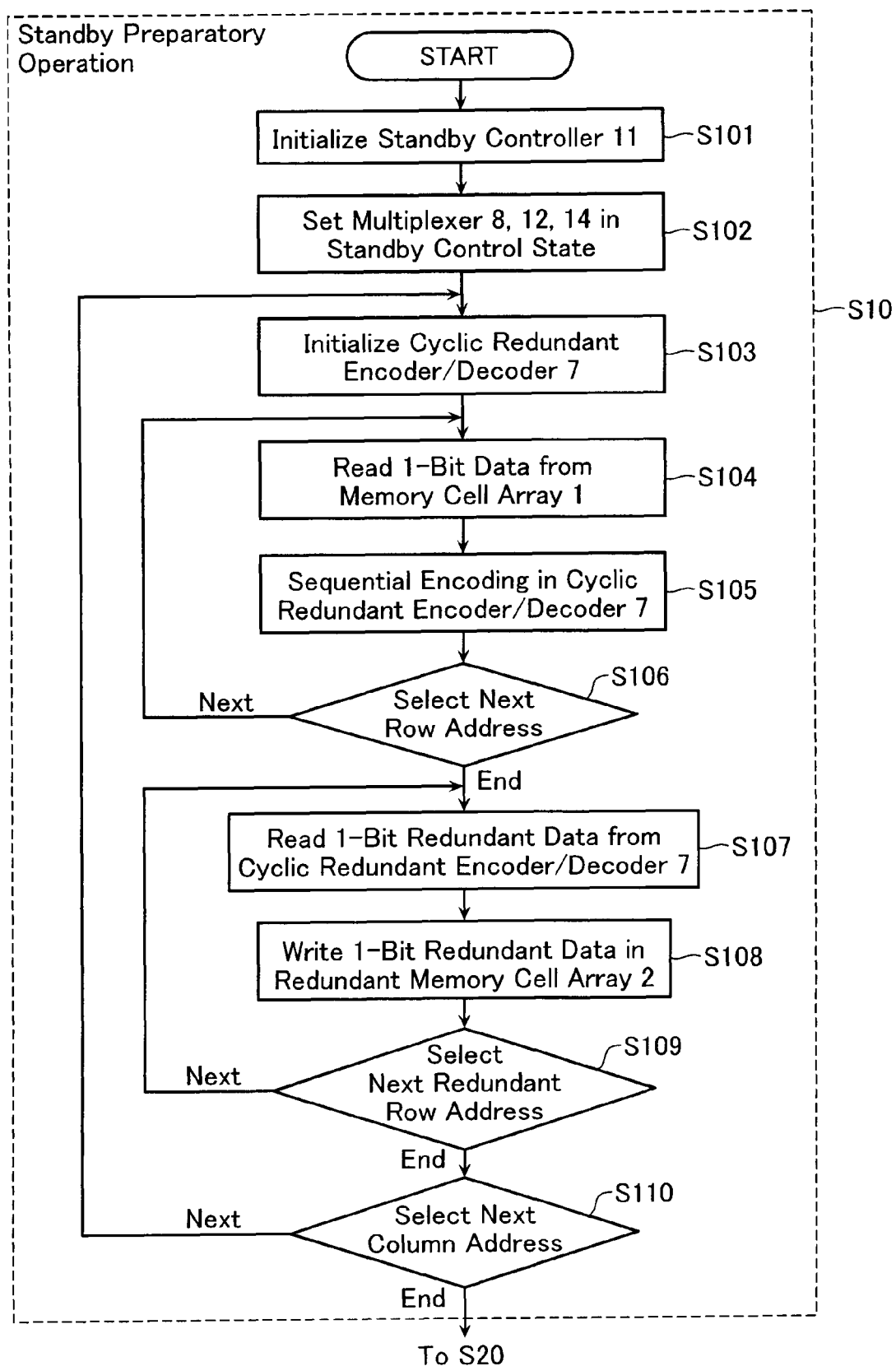
FIG. 4 is a flowchart illustrative of an operation of the standby function in the semiconductor memory device of the present embodiment.

A detailed procedure of the standby preparatory operation (S10) is described first with reference to FIG. 4.

The standby preparatory operation is started when the standby controller 11 receives the standby state control signal SE from external instructive of starting the standby function. On receipt of the standby state control signal SE, the standby controller 11 is initialized (S101), and the standby controller 11 provides the internal standby control signal LSE at "H". As a result, the data multiplexer 8, the column address multiplexer 12 and the row address multiplexer 14 are set in a state (standby control state) to selectively receive the encoded/decoded data CD, the standby control column address SCA, the standby control row address SRA (S14).

Next, the standby controller 11 provides the reset signal RESET, which initializes the cyclic redundant encoder/decoder 7 (S103). Specifically, the D-type flip-flops D1, D2, D3 are given "0", "0", "0", respectively. The reset signal RESET may be a synchronous signal or an asynchronous signal. If the reset signal RESET is the asynchronous signal, the initialization can be terminated when the reset signal RESET is simply turned to "1" (active state) once and held at "0" (inactive state) again. If the reset signal RESET is the synchronous signal, the initialization can be terminated when the reset signal RESET is once turned to "1" (active state) and the clock signal CLK rises in this condition.

Subsequently, 1-bit data addressed by the internal column address LCA and the internal row address LRA output from the column address multiplexer 12 and the row address multiplexer 14 is read out of the memory cell array 1 (S104), and sequentially encoded bit by bit in the cyclic redundant encoder/decoder 7 (S105). In order to start encoding (S104, S105), the encoding instruction signal ENCODE is switched from "0" to "1", and this state is held. As a result, the logic gate 70 provides an exclusive-OR of the output signal from the D-type flip-flop D3 and the output data DO to allow for encoding.

Figure 7:
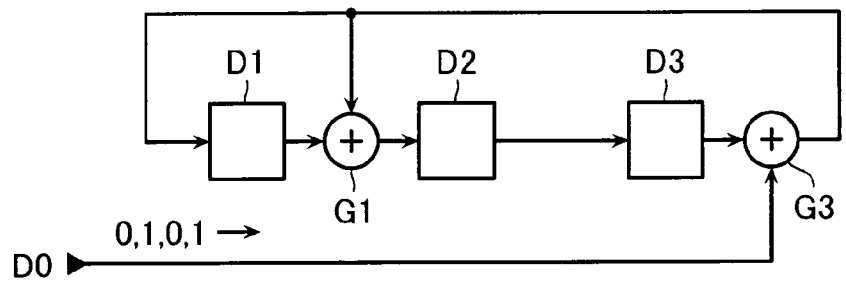
FIG. 7 shows a brief circuit diagram when the cyclic redundant encoder/decoder 7 shown in FIG. 1 serves as the encoder, and a table illustrative of the states of data shift.

FIG. 7 shows a brief circuit diagram when the cyclic redundant encoder/decoder 7 serves as the encoder, and the states of data shift in the LFSR including the D-type flip-flops D1-D3. As shown in FIG. 7, after the initialization (S103), all the D-type flip-flops D1-D3 hold "0".

After completion of processing for one row address RA, the next row address is designated and, based on this address, an internal row address is designated and reading (S104) and encoding (S105) are repeated like the above (S106). Reading (S104) and encoding (S105) are repeated until the row decoder 3 selectively activates the word lines WL one by one to select all the word lines WL.

After completion of reading (S104) and encoding (S105), the cyclic redundant encoder/decoder 7 eventually stores the redundant data corresponding to the data stored in the cell having the selected column address (internal column address LCA) among the data in the memory cell array 1.

By way of example, it is assumed that data DO (1, 0, 1, 0) is fed bit by bit, beginning from the leading bit, at steps S105-1, S105-2, S105-3, S105-4, respectively. In this case, the values (d1, d2, d3) held in the D-type flip-flops D1-D3 vary as shown in FIG. 7.

Step S105-1: (1, 1, 0)
Step S105-2: (0, 1, 1)
Step S105-3: (0, 0, 1)
Step S105-4: (1, 1, 0)

In this case, (1, 1, 0) in the step S105-4 are shifted in a lower-bit first-out manner (the value held in the D-type flip-flop D3 is output first) to generate (0, 1, 1), which are added as 3-bit redundant data to the data DO (1, 0, 1, 0).

Figure 8:
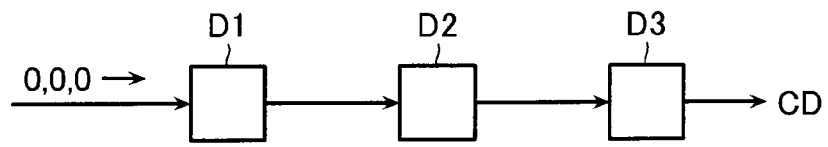
FIG. 8 shows a brief circuit diagram when the cyclic redundant encoder/decoder 7 shown in FIG. 1 executes shift-read processing, and a table illustrative of the states of data shift.

Next, the redundant data stored in the cyclic redundant encoder/decoder 7 is read out bit by bit (S107). Specifically, as shown in FIG. 8, the shift instruction signal SHIFT is turned to "1" (active state) to halt the functions of the exclusive-OR operational units G0, G1, G3, G4 such that the feedback can not work. As a result, the values held in the D-type flip-flops D1-D3 are shifted to the next stages at rises of the clock signal CLK (steps S107-0 through S107-2) and read out as the encoded/decoded data CD. The encoded/decoded data CD read out is written bit by bit in the redundant memory cell array 2, with the redundant row decoder 4 activating the redundant word lines RWL one by one (S108).

Until the redundant word lines RWL in the redundant memory cell array 2 are activated one by one and all the redundant word lines RWL are completely selected, the procedures of S107, S108 are repeated (S109). The procedures of the above S103-S109 are repeated over all the column addresses CA to cause the cyclic redundant encoder/decoder 7 to store the redundant data (S110). Thus, the redundant data corresponding to all data held in the memory cell array 1 can be stored in the redundant memory cell array 2.

A detailed procedure of the standby state operation (S20) is described next with reference to FIG. 5. In the standby state operation, in order to reduce current consumed in the standby state for saving power, cutting off the supply voltage, lowering the supply voltage, extending the period of rewrite (refresh) and so forth are executed to set a power saving state (S201). Specifically, it is possible to cut off power supplied to circuits unnecessary for holding data (for example, the cyclic redundant encoder/decoder 7 and the data multiplexer 8). If high-speed operation is not required, it is also possible to lower the supply voltage.

Subsequently, while maintaining the power saving state, the data held in the memory cell array 1 and the redundant memory cell array 2 is rewritten (refreshed). First, the row address multiplexer 14 is set in a state (rewrite control state) in which it can receive a rewrite row address RRA output from the refresh controller 13 (S202). Then, the state of the standby state control signal SE is checked and, if continuation of the standby state is instructed, the standby state operation (S20) is continued. If transition to the standby return state is instructed, the flow transfers to the standby return operation (S30). If the standby state is continued, rewrite in the memory cell array 1 and the redundant memory cell array 2 is executed (S204).

The method thereof is similar in a normal DRAM and comprises activating word lines WL and redundant word lines RWL one by one and amplifying a small signal read out on a bit line BL through the sense amplifier 5. The sense amplifier 5 is kept in the active state to amplify the voltage on the bit line. The amplified bit-line voltage is used to rewrite data back to the memory cell in the memory cell array 1 or the redundant memory cell in the redundant memory cell array 2.

Next, the circuits are left in the non-operation state during a certain leaving time Tn (S205). After elapse of the leaving time Tn, the flow returns to S203 to repeat the operation of S204 as far as there is no instruction for transition to the standby return state. In order to achieve current consumption to be suppressed lower, the leaving time Tn is set at a time as long as possible within a range in which the charge held in the memory cell or the redundant memory cell can not be discharged.

A detailed procedure of the standby return operation (S30) is described next with reference to FIG. 6. As described before, the standby return operation includes reading the cell data from the memory cell array 1 and the redundant data from the redundant memory cell array 2 to search a data error caused in cell data on a memory cell in the memory cell array 1 during the standby state operation (S20) (error search processing); and correcting the searched error in the cyclic redundant encoder/decoder 7 (error correction processing).

First, the power saving state is released to return to the normal state (S301). For example, operations to be followed may include:

(1) restarting application of the supply voltage to part of circuits once cutoff;

(2) resuming the lowered supply voltage to the normal voltage; or (3) returning the rewrite period to the normal period.

Subsequently, the data multiplexer 8, the column address multiplexer 12 and the row address multiplexer 14 are set in a state (standby control state) to selectively receive the decoded/decoded data CD, SCA, RRA, respectively (S302).

Next, the cyclic redundant encoder/decoder 7 is initialized (S303). Specifically, the values held in the D-type flip-flops D1, D2, D3 are all made "0".

Subsequently, 1-bit data selected by the internal column address LCA and the internal row address LRA is read out of the memory cell array 1 and the redundant memory cell array 2 (S304).

The 1-bit read data is fed to the cyclic redundant encoder/decoder 7 to sequentially perform error search processing in the cyclic redundant encoder/decoder 7 (S305). To start the error search processing, the decoding instruction signal DECODE is made "1" (active state). While keeping this state, the output data DO is received bit by bit in accordance with the clock signal CLK to sequentially execute the error search processing.

The processes in S304 and S305 are executed with a word line WL or the corresponding redundant word line RWL activated one by one. After completion of the processes, the next word line WL (row address) or redundant word line RWL is selected to execute the processes in S304 and S305 similarly (S306). These processes are repeated over all the word lines WL and redundant word lines RWL.

Figure 9:
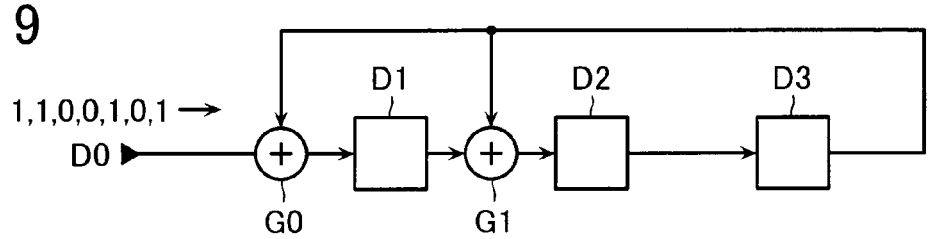
FIG. 9 shows a brief circuit diagram when error search processing is executed in the cyclic redundant encoder/decoder 7 shown in FIG. 1, and a table illustrative of the states of data shift.

A detailed processing of the error search is described with reference to FIG. 9. FIG. 9 shows a brief circuit diagram when the cyclic redundant encoder/decoder 7 executes the error search processing, and the states of data shift in the LFSR including the D-type flip-flops D1-D3. On the back of FIGS. 7, 8, the following description is given on the assumption that original data (1, 0, 1, 0) is encoded to obtain redundant data (0, 1, 1).

It is assumed that such the data is led in as (1, 0, 1, 0, 0, 1, 1) from the leading bit in order (steps S305-1, S305-2, ... ) without causing any data error as shown in FIG. 9. The values held in the D-type flip-flops D1-D3 are all initialized to "0".

In this case, the values (d1, d2, d3) held in the D-type flip-flops D1, D2, D3 vary at each step as shown in FIG. 9.
Step S305-1: (1, 0, 0)
Step S305-2: (0, 1, 0)
Step S305-3: (1, 0, 1)
Step S305-4: (1, 0, 0)
Step S305-5: (0, 1, 0)
Step S305-6: (1, 0, 1)
Step S305-7: (0, 0, 0)
After completion of processing the trailing bit (S305-7), the values held in the D-type flip-flops D1-D3 become (0, 0, 0). This means that no error occurs in data. In this case, subsequent error correction procedures (S307-S311) can be omitted though they may be executed as they are. This is because the syndrome SYN inevitably becomes "0" as described later if the values held in the D-type flip-flops D1-D3 are all made "0".

Figure 10:
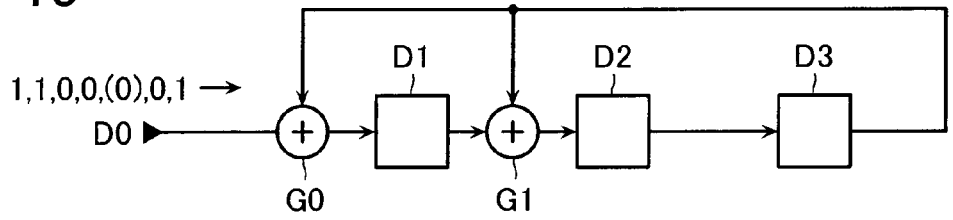
FIG. 10 shows a brief circuit diagram when error search processing is executed in the cyclic redundant encoder/decoder 7 shown in FIG. 1, and a table illustrative of the states of data shift.

On the other hand, if a data error occurs in such the data and results in (1, 0, (0), 0, 0, 1, 1) as shown in FIG. 10 (the third bit (0) is the data error), the values (d1, d2, d3) held in the D-type flip-flops D1, D2, D3 vary at each step.
Step S305-1: (1, 0, 0)
Step S305-2: (0, 1, 0)
Step S305-3: (0, 0, 1)
Step S305-4: (1, 1, 0)
Step S305-5: (0, 1, 1)
Step S305-6: (0, 1, 1)
Step S305-7: (0, 1, 1)
In this case, the steps up to S305-2 are same as those in the case with no data error (FIG. 9). After the input of the data error-caused third bit ((0)) at the step S305, though, the values held in the D-type flip-flops D1-D3 differ from those in FIG. 9. At the time of the step S305-3, it is not yet possible to determine where in the cell data the data error arises. After completion of processing the trailing bit (step S305-7), the values held in the D-type flip-flops D1-D3 become (0, 1, 1), which indicate that a data error arises on either in a bit string of 7 bits.

Thereafter, the data once read out of the memory cell array 1 at S304 is again read out of the memory cell array 1 bit by bit (S307) and transferred in turn to the cyclic redundant encoder/decoder 7 to sequentially execute error correction (S308). Such the procedure is applied to all the word lines WL while switching the row address RA (S310).

Figure 11:
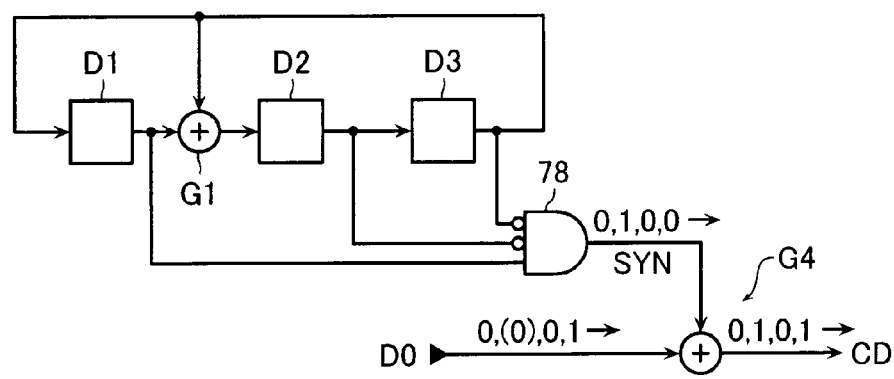
FIG. 11 shows a brief circuit diagram when error correction processing is executed in the cyclic redundant encoder/decoder 7 shown in FIG. 1, and a table illustrative of the states of data shift.

FIG. 11 shows a brief circuit diagram when the cyclic redundant encoder/decoder 7 executes error correction processing, and the states of data shift in the LFSR including the D-type flip-flops D1-D3. On execution of the error correction processing, the decoding instruction signal DECODE, the encoding instruction signal ENCODE, the shift instruction signal SHIFT and the reset signal RESET are all set at "0" (inactive state). In this state, the output data DO is fed bit by bit into the exclusive-OR operational unit G4 at rises of the clock signal CLK.

It is assumed that the error-caused data (1, 0, (0), 0, 0, 1, 1) is fed in order from the leading bit at steps S308-1, S308-2, ... sequentially as shown in FIG. 11.

In this case, the values held in the D-type flip-flops D1-D3 at steps S308-1 through S308-7 and the syndrome SYN detected at a syndrome detector 78 are as shown in FIG. 11. Namely, the syndrome SYN on the data error-caused third bit becomes "1", which indicates that the third bit is the location where the error has occurred. The exclusive-OR operational unit G4 operates an exclusive-OR of the syndrome SYN and the output data DO and provides it as the encoded/decoded data CD. The encoded/decoded data CD becomes error-corrected data (1, 0, 1, 0, 0, 1, 1), of which 4 bits in the first half are written bit by bit in the memory cell array 1 for correction.

After completion of the procedures at S304-S309 over all the word lines WL, the column address CA is switched to the next to repeat the operations at S304-S309 (S311). After completion of the operations at S304-S309 over all the column addresses CA, the data multiplexer 8, the column address multiplexer 12 and the row address multiplexer 14 are returned from the standby control state to the normal operation state that enables the normal write/read operation (S312). Namely, the data multiplexer 8, the column address multiplexer 12 and the row address multiplexer 14 are set in a state to receive the external input data DI, the column address CA, and the row address RA. In accordance with the foregoing, the standby operation (S10-S30) is completed.

FIG. 11 shows an example of error correction processing also performed for the redundant data (steps 308-5 through 308-7) though it is sufficient to correct errors only in cell data. Accordingly, after the error correction up to the steps 308-1 through 308-4, the processing may be finished. If the error correction processing is desirably executed for the redundant data, the processing may be executed also at the steps 308-5 through 308-7. In accordance with the above example, for a cell data string of 4 bits such as (1, 0, 1, 0), redundant data of 3 bits such as (0, 1, 1) is generated. In this case, it is possible to correct 1-bit error when it occurs in a data string of total 7 bits such as (1, 0, 1, 0, 0, 1, 1).

The effect of the embodiment is described below.

It is obvious that the longer the leaving time Tn in the non-operation state (S205) in the standby state operation S20, the lower the current consumption on standby can be suppressed correspondingly. The leaving time Tn suffers restrictions on the data retention property of the DRAM cell and can not be elongated excessively. Namely, in a normal DRAM cell, after left for several 100 ms to several seconds, the DRAM cell discharges and causes a data error. Further, the data retention property of the DRAM cell exhibits large variations among memory cells and suffers from environmental conditions such as temperatures and supply voltages.

Therefore, in a normal DRAM cell that does not have such the error correction function of the present embodiment, setting the leaving time Tn so as to prevent an occurrence of a discharge-caused data error requires an extremely large margin to be given to an expected data retention property. For example, if the data retention property of the DRAM cell has an average of several seconds, an allowable leaving time Tn is several 100 ms. If the data retention property of the DRAM cell has an average of several 100 ms, an allowable leaving time Tn is several 10 ms. Thus, it is required to set the allowable leaving time Tn one digit smaller than the data retention property, with a margin.

In contrast, in accordance with the present embodiment, the cyclic redundant encoder/decoder 7 can correct a discharge-caused data error and setting the leaving time Tn requires no large margin relative to the expected data retention property. Accordingly, the leaving time Tn can be set larger by the extent. Therefore, the current consumed on standby can be reduced to around $\frac{1}{10}$ of the conventional one.

The embodiment of the invention has been described above though the present invention is not limited to the embodiment but rather can be given various modifications and additions without departing from the scope of the invention. For example, the above embodiment exemplifies the DRAM though the present invention is not limited to this but rather can be applied to SRAMs, flash EEPROMs, and all other semiconductor memory devices that have a standby function and may cause a data error during a standby function operation. It is also applicable to not only data errors caused by discharge of cell charge but also errors caused by soft errors.

In the above embodiment, cell data stored in memory cells along the word line WL is encoded and redundant data thereof is stored in those along the corresponding redundant word line RWL. The present invention is not limited to this, but rather the target cells to store redundant data can be modified appropriately in accordance with operation modes and so forth. The code length of redundant data can be determined freely independent of the number of bit lines BL.

It is not required to subject all memory cells in the memory cell array 1 to the data error correction of the present invention. It is also possible to subject part of memory cells to that.

What is claimed is:

1. A semiconductor memory device configured to execute a standby operation for saving power during standby, the device comprising:
   a memory cell array including a plurality of memory cells arranged at intersections of bit lines and word lines and operative to store cell data;
   a redundant memory cell array including a plurality of redundant memory cells arranged at intersections of said bit lines and redundant word lines and operative to store redundant data for error correction of cell data stored in said memory cell array;
   a sense amplifier operative to sense and amplify the voltage on said bit line to read said cell data or said redundant data from said memory cell array or said redundant memory cell array;
   a cyclic redundant encoder/decoder operative to encode said cell data through sequential processing to generate said redundant data or operative to decode said cell data and said redundant data through sequential processing to execute error correction of said cell data;
   a row decoder operative to selectively activate said word line or said redundant word line in accordance with a row address signal; and
   a column decoder operative to selectively activate a data line to read said cell data or said redundant data in accordance with a column address signal.

2. The semiconductor memory device according to claim 1, further comprising a controller operative to start operation in response to the input of a standby state control signal instructive of starting a standby operation to control said cyclic redundant encoder/decoder.

3. The semiconductor memory device according to claim 2, wherein said controller during said standby operation supplies an address for said sequential processing to said row decoder and said column decoder.

4. The semiconductor memory device according to claim 1, further comprising a data multiplexer configured to selectively receive data fed from external for writing in said memory cell array, or said cell data/said redundant data output from said cyclic redundant encoder/decoder.

5. The semiconductor memory device according to claim 4, further comprising a write-side column decoder operative to selectively activate a data line to provide data output from said data multiplexer.

6. The semiconductor memory device according to claim 1, further comprising an address multiplexer configured to selectively receive an address fed from external for normal reading/writing in said memory cell array, an address for said sequential processing or a rewrite address.

7. The semiconductor memory device according to claim 1, wherein said cyclic redundant encoder/decoder is a linear feedback shift register operative to receive data output from said column decoder bit by bit to sequentially execute encoding and decoding.

8. The semiconductor memory device according to claim 1, wherein said cyclic redundant encoder/decoder encodes said cell data through sequential processing in accordance with an address for said sequential processing to generate said redundant data in a standby preparatory operation for preparing transition to said standby operation, and decodes said cell data and said redundant data through sequential processing to execute error correction of said cell data in a standby return operation for returning from said standby state to a normal operation state.

9. The semiconductor memory device according to claim 1, further comprising:
   a standby controller operative to start operation in response to the input of a standby state control signal instructive of starting a standby operation to provide a row address and a column address for said sequential processing during said standby operation;
   a refresh controller operative on rewriting to provide a rewrite address for rewriting;
   a column address multiplexer configured to selectively receive a column address fed from external for normal reading/writing in said memory cell array, or a column address for said sequential processing;
   a row address multiplexer configured to selectively receive a row address fed from external for normal reading/writing in said memory cell array, a row address for said sequential processing or a rewrite row address.

10. The semiconductor memory device according to claim 9, wherein said cyclic redundant encoder/decoder, once initialized after starting said standby operation, encodes said cell data through sequential processing to generate and temporarily store said redundant data.

11. The semiconductor memory device according to claim 9, further comprising a data multiplexer configured to selectively receive data fed from external for writing in said memory cell array, or said cell data/said redundant data output from said cyclic redundant encoder/decoder.

12. The semiconductor memory device according to claim 11, further comprising a write-side column decoder operative to selectively activate a data line to provide data output from said data multiplexer.

* * * * *